United States Patent
Negoro

(10) Patent No.: US 7,755,337 B2
(45) Date of Patent: Jul. 13, 2010

(54) CURRENT SENSING CIRCUIT AND VOLTAGE REGULATOR USING THE SAME

(75) Inventor: Takaaki Negoro, Kanagawa-ken (JP)

(73) Assignee: Ricoh Company, Ltd., Tokyo (JP)

( * ) Notice: Subject to any disclaimer, the term of this patent is extended or adjusted under 35 U.S.C. 154(b) by 261 days.

(21) Appl. No.: 11/978,601

(22) Filed: Oct. 30, 2007

(65) Prior Publication Data

US 2008/0100276 A1    May 1, 2008

(30) Foreign Application Priority Data

Oct. 30, 2006   (JP)   ............................. 2006-293780

(51) Int. Cl.
  *G05F 1/573*   (2006.01)
(52) U.S. Cl. .................................... 323/277
(58) Field of Classification Search .......... 323/273–277
    See application file for complete search history.

(56) References Cited

U.S. PATENT DOCUMENTS

| | | | |
|---|---|---|---|
| 5,942,881 A * | 8/1999 | Okada et al. ................. | 323/277 |
| 6,664,773 B1 * | 12/2003 | Cunnac et al. ............... | 323/277 |
| 6,897,638 B2 * | 5/2005 | Miyanaga et al. ........... | 323/274 |
| 7,078,885 B2 * | 7/2006 | Prexl .......................... | 323/277 |
| 7,109,552 B2 * | 9/2006 | Wu ............................. | 257/335 |
| 7,183,755 B2 * | 2/2007 | Itoh et al. .................... | 323/274 |
| 7,411,376 B2 * | 8/2008 | Zhang ......................... | 323/277 |

FOREIGN PATENT DOCUMENTS

| JP | 2002-23868 | 1/2002 |
|---|---|---|
| JP | 3683185 | 6/2005 |

* cited by examiner

*Primary Examiner*—Jeffrey L Sterrett
*Assistant Examiner*—Fred E Finch, III
(74) *Attorney, Agent, or Firm*—Dickstein Shapiro LLP

(57) ABSTRACT

A current sensing circuit for sensing an output current generated by a voltage regulator includes a first double-diffused metal-oxide semiconductor transistor and a current-voltage converter. The first double-diffused metal-oxide semiconductor transistor has a first gate terminal to receive an output control signal from a control circuit of the voltage regulator. The first double-diffused metal-oxide semiconductor transistor is configured to output a current proportional to the output current according to the output control signal. The current-voltage converter is connected to the first double-diffused metal-oxide semiconductor transistor. The current-voltage converter is configured to convert the proportional current to a corresponding voltage.

17 Claims, 2 Drawing Sheets

CURRENT SENSING CIRCUIT AND VOLTAGE REGULATOR USING THE SAME

CROSS-REFERENCE TO RELATED APPLICATIONS

This application claims priority from Japanese Patent Application No. 2006-293780, filed on Oct. 30, 2006 in the Japanese Patent Office, the entire contents of which are incorporated by reference herein.

FIELD OF THE INVENTION

The present invention relates to a current sensing circuit and a voltage regulator using the current sensing circuit, and more particularly, to a current sensing circuit used to sense an output current in a voltage regulator, allowing a reduction in size without degrading current sensing performance.

BACKGROUND OF THE INVENTION

Current limiting circuits are used to control current flow in electronic circuitry. Typically, a voltage regulator includes a current limiting circuit for overcurrent protection that prevents excessive current from flowing into a load circuit. Such a current limiting circuit includes a current sensing circuit to monitor current output from the voltage regulator.

Referring to FIG. 1, a circuit diagram illustrating an example of a conventional voltage regulator 100 is described.

The voltage regulator 100 includes an output transistor M101, resistors R101 and R102, a reference voltage generator 101, an error amplifier 102, an input terminal IN, and an output terminal OUT. The voltage regulator 100 further includes a current limiting circuit 103. The current limiting circuit 103 includes transistors M102 through M104, a resistor R103, and a constant current source 105. The transistors M101, M102, and M104 are P-channel metal-oxide semiconductor (PMOS) transistors. The transistor M103 is an N-channel metal-oxide semiconductor (NMOS) transistor.

As shown in FIG. 1, the voltage regulator 100 is a series regulator that converts an input voltage Vin into a regulated output voltage Vout through the output transistor M101, and provides an output current io to a load circuit connected therewith (not shown).

In voltage regulation, the output transistor M101 receives an output control signal at a gate and controls current flow according to the control signal. The reference voltage generator 101 outputs a given reference voltage Vref. The resistors R101 and R102, forming a voltage divider connected to the output terminal OUT, serve to output a feedback voltage Vfb corresponding to the output voltage Vout. The error amplifier 102 receives the reference voltage Vref at an inverting input and the feedback voltage Vfb at a non-inverting input. Based on the received signals, the error amplifier 102 generates the output control signal, which controls operation of the output transistor M101 so that the feedback voltage Vfb is substantially equal to the reference voltage Vref.

During the voltage regulation, the current limiting circuit 103 monitors the output current io, and upon determining that the output current io becomes excessive, limits the current flow through the output transistor M101 so that the output current io does not exceed a given maximum limit.

In the current limiting circuit 103, the transistor M102 receives the output control signal at a gate, and outputs a current proportional to the output current io according to the control signal. The resistor R103 converts the proportional current into a corresponding voltage which is indicative of the output current io.

The corresponding voltage is then applied to a gate of the transistor M103, which turns on when the applied voltage reaches a given threshold level, indicating that the output current io reaches the given maximum limit. The turn-on of the transistor M103 reduces a voltage applied to a gate of the transistor M104. This results in a current limit signal applied to the gate of the output transistor M101, limiting current flow through the output transistor M101 so as to prevent the output current io from exceeding the given maximum limit.

In the voltage regulator 100 described above, the transistor M102 and the resistor R103 form a current sensing circuit. In general, such current sensing circuit is required to be small in size, especially in the application to voltage regulators. This requirement arises from a recent trend toward smaller electronic devices, where size reduction is an important issue in developing voltage regulators having current sensing capabilities.

One approach to achieving a size reduction in a current sensing circuit is to use a small transistor device for a current sensing transistor, such as the transistor M102 in the voltage regulator 100. However, since in practice a current sensing transistor is subjected to a relatively large amount of current, this approach has a limitation in that it makes the current sensing circuit prone to failures due to overloads on the small transistor device, sacrificing stability and accuracy in current sensing performance. Thus, what is needed is a reliable, small current sensing circuit that can operate in a voltage regulator without degrading current sensing performance.

BRIEF SUMMARY OF THE INVENTION

This patent specification describes a novel current sensing circuit that can be used to sense an output current in a voltage regulator, allowing a reduction in size without degrading current sensing performance.

In one embodiment, the novel current sensing circuit for sensing an output current generated by a voltage regulator includes a first double-diffused metal-oxide semiconductor transistor and a current-voltage converter. The first double-diffused metal-oxide semiconductor transistor has a first gate terminal to receive an output control signal from a control circuit of the voltage regulator. The first double-diffused metal-oxide semiconductor transistor is configured to output a current proportional to the output current according to the output control signal. The current-voltage converter is connected to the first-double-diffused metal-oxide semiconductor transistor. The current-voltage converter is configured to convert the proportional current to a corresponding voltage.

This patent specification also describes a novel voltage regulator having a current sensing circuit capable of sensing an output current, allowing a reduction in size without degrading current sensing performance.

In one embodiment, the novel voltage regulator includes an input terminal, an output terminal, an output transistor, a control circuit, and a current sensing circuit. The input terminal is configured to receive an input voltage. The output terminal is configured to provide a regulated output voltage and an output current. The output transistor has a control terminal to receive an output control signal. The output transistor is configured to control current flow therethrough according to the output control signal so as to regulate the output voltage. The control circuit is configured to provide the output control signal so that a voltage proportional to the output voltage is substantially equal to a given reference voltage. The current sensing circuit is configured to sense the output current. The current sensing circuit includes a first double-diffused metal-oxide semiconductor transistor and a current-voltage converter. The first double-diffused metal-oxide semiconductor transistor has a first gate terminal to receive the output control signal. The first double-diffused metal-oxide semiconductor transistor is configured to output a current proportional to the output current according to the output control signal. The current-voltage converter is connected to the first double-diffused metal-oxide semiconductor transistor. The current-voltage converter is configured to convert the proportional current to a corresponding voltage.

This patent specification further describes a novel current sensing circuit that can be used to sense an output current in a voltage regulator, allowing a reduction in size without degrading current sensing performance.

In one embodiment, the novel current sensing circuit for sensing an output current generated by a voltage regulator includes a first transistor, a current-voltage converter, and a sub-circuit. The first transistor has a first gate terminal to receive an output control signal from a control circuit of the voltage regulator. The first transistor is configured to output a current proportional to the output current according to the output control signal. The current-voltage converter is connected to the first transistor. The current-voltage converter is configured to convert the proportional current to a corresponding voltage. The sub-circuit is connected between a first drain terminal of the first transistor and the current-voltage converter. The sub-circuit includes a control element and a second transistor. The control element is configured to output a current control signal. The second transistor is a double-diffused metal-oxide semiconductor transistor and has a second gate terminal to receive the current control signal. The second transistor is configured to control current flow therethrough according to the current control signal.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION OF THE INVENTION

Figure 1:
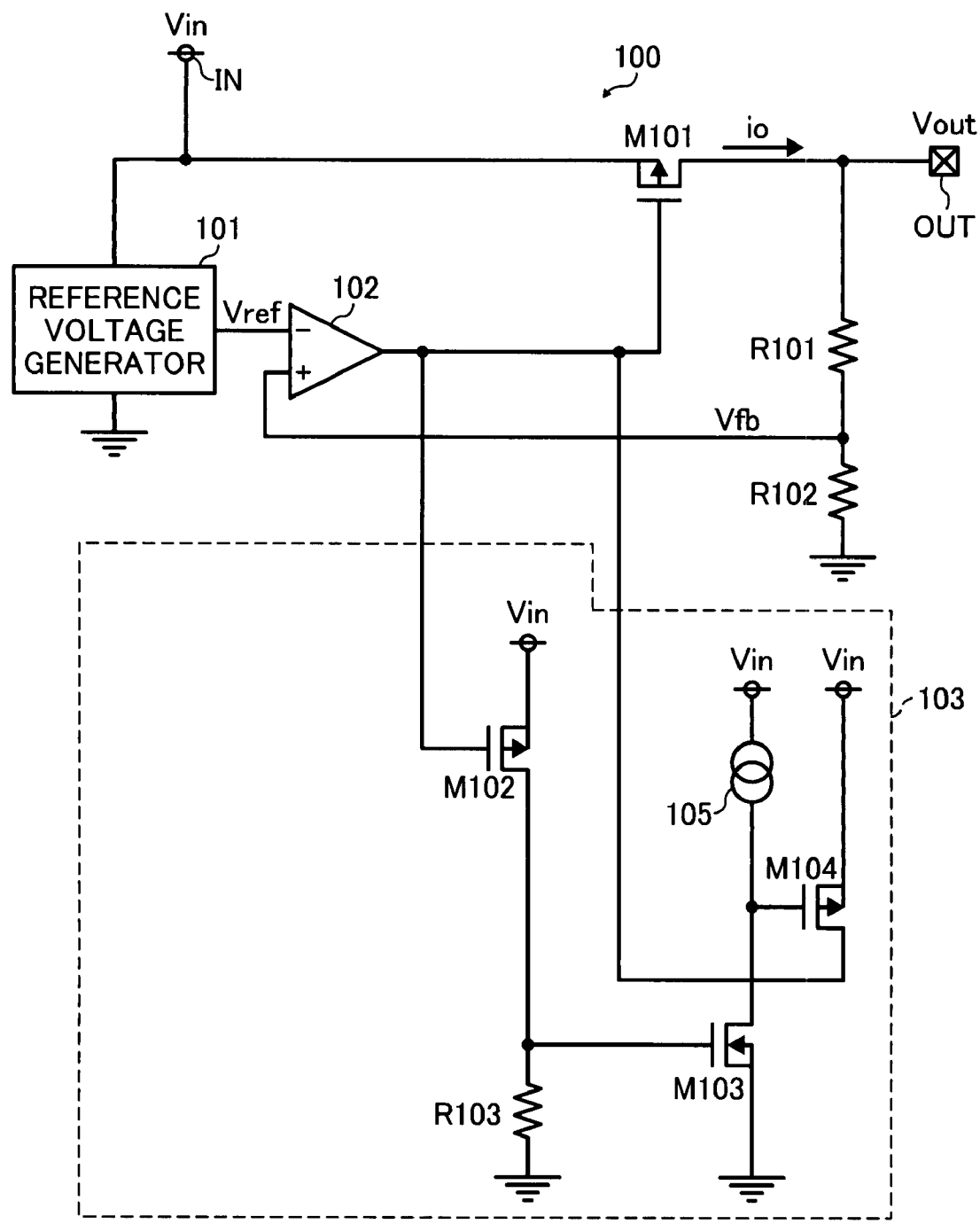
FIG. 1 is a circuit diagram illustrating an example of a conventional voltage regulator.

In describing preferred embodiments illustrated in the drawing, specific terminology is employed for the sake of clarity. However, the disclosure of this patent specification is not intended to be limited to the specific terminology so selected, and it is to be understood that each specific element includes all technical equivalents that operate in a similar manner. Referring now to the drawings, example embodiments of the present patent application are described.

Figure 2:
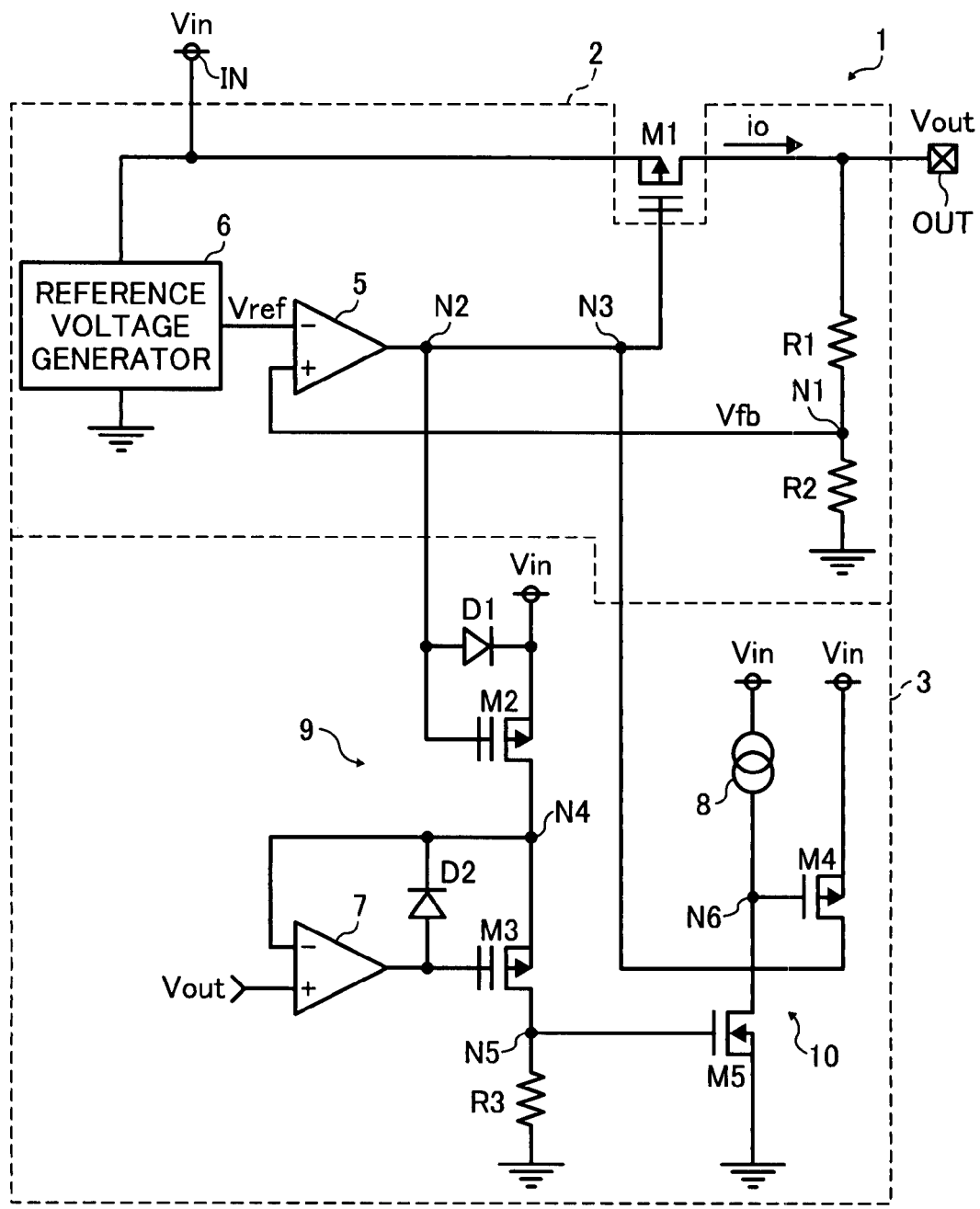
FIG. 2 is a circuit diagram illustrating an example of a voltage regulator according to at least one example embodiment of this patent specification.

Referring to FIG. 2 of the drawings, a circuit diagram illustrating an example of a voltage regulator 1 according to at least one example embodiment of this patent specification is described.

The voltage regulator 1 includes an input terminal IN, an output terminal OUT, an output transistor M1, a control circuit 2, and a current limiting circuit 3.

The control circuit 2 includes an error amplifier 5, a reference voltage generator 6, and resistors R1 and R2.

The current limiting circuit 3 includes a current sensing circuit 9 and a signal generating circuit 10. The current sensing circuit 9 includes transistors M2 and M3, an operational amplifier 7, diodes D1 and D2, and a resistor R3. The signal generating circuit 10 includes transistors M4 and M5, and a constant current source 8.

As shown in FIG. 2, the output transistor M1 is connected between the input terminal IN and the output terminal OUT, and has a gate connected to the control circuit 2. The input terminal IN is connected to a power source (not shown) from which an input voltage Vin is provided to the voltage regulator 1. The output terminal OUT is connected to a load (not shown) to which an output voltage Vout is supplied from the voltage regulator 1.

In the control circuit 2, the reference voltage generator 6 is connected between the input terminal IN and ground. The resistors R1 and R2 are connected in series between the input voltage Vin and ground, forming a node N1 therebetween. The error amplifier 5 has an inverting input connected to the reference voltage generator 6 and a non-inverting input connected to the node N1, so that a reference voltage Vref is applied to the inverting input from the reference voltage generator 6, and a feedback voltage Vfb is applied to the non-inverting input from the node N1. The error amplifier 5 has an output connected to the gate of the output transistor M1, forming nodes N2 and N3 therebetween. The nodes N2 and N3 are respectively connected to the current limiting circuit 3.

In the current limiting circuit 3, the transistor M2 has a gate connected to the node N2 of the control circuit 2. The transistors M2 and M3 and the resistor R3 are connected in series between the input voltage Vin and ground, forming a node N4 between the transistors M2 and M3 and a node N5 between the transistor M3 and the resistor R3. The operational amplifier 7 has an inverting input connected to the node N4, a non-inverting input connected to the output voltage Vout, and an output connected to a gate of the transistor M3.

The transistor M5 and the constant current source 8 are connected in series between the input voltage Vin and ground, forming a node N6 therebetween. The transistor M5 has a gate connected to the node N5. The transistor M4 is connected between the input voltage Vin and the node N3 of the control circuit 2, and has a gate connected to the node N6.

In the voltage regulator 1, the diode D1 has an anode connected to the gate of the transistor M1 and to the gate of the transistor M2, respectively. The diode D1 further has a cathode connected to a source of the transistor M1 and to a source of the transistor M2, respectively. The diode D2 has an anode connected to the gate of the transistor M3 and a cathode connected to a source of the transistor M3.

The transistors M1 through M4 are P-channel metal-oxide semiconductor (PMOS) transistors and the transistor M5 is an N-channel metal-oxide semiconductor (NMOS) transistor. The components of the voltage regulator 1 may be constructed on a single integrated circuit (IC).

As shown in FIG. 2, the voltage regulator 1 is formed as a series regulator providing an output current io to the load, where the output voltage Vout is regulated to a given constant voltage lower than the input voltage Vin through the output transistor M1 connected in series with the load.

In operation, the output transistor M1 performs voltage regulation by controlling current flow therethrough while the control circuit 2 controls operation of the output transistor M1. The current limiting circuit 3 maintains the output current io at or below a given maximum limit Ia, where the current sensing circuit 9 serves to sense the output current io, and the signal generating circuit 10 serves to generate a current limit signal upon determining that the output current io reaches the given maximum limit Ia.

In the control circuit 2, the reference voltage generator 6 outputs the reference voltage Vref. The resistors R1 and R2, forming a voltage divider, output the feedback voltage Vfb. The feedback voltage Vfb indicates a voltage at the node N1, which is proportional to the output voltage Vout. The error amplifier 5 receives the reference voltage Vref at the inverting input and the feedback voltage Vfb at the non-inverting input to output an output control signal to the gate of the output transistor M1. The output transistor M1 operates according to the output control signal so that the feedback voltage Vfb is substantially equal to the reference voltage Vref, which indicates that the output voltage Vout is substantially equal to the given constant voltage.

In the current sensing circuit 9, the transistor M2 receives the output control signal at the gate and according to the output control signal, outputs a current ia proportional to the output current io.

The operational amplifier 7 and the transistor M3 control the current ia. The operational amplifier 7 receives a drain voltage of the transistor M2 at the inverting input and the output voltage Vout at the non-inverting input to output a signal to the gate of the transistor M3, which controls operation of the transistor M3 so that the drain voltage of the transistor M2 is substantially equal to the output voltage Vout.

Then, the resistor R3 converts the current ia to a corresponding voltage va. As the current ia is proportional to the output current io, the voltage va is indicative of the output current io.

In the signal generating circuit 10, the voltage va is applied to the gate of the transistor M5 and a voltage at the node N6 is applied to the gate of the transistor M4. The transistor M5 turns on when the voltage va reaches a threshold voltage, which indicates that the output current io reaches the given maximum limit La. This causes a reduction in the gate voltage of the transistor M4, so that the current limit signal, being a high voltage, is applied to the gate of the output transistor M1 to reduce the output current io.

The voltage regulator 1 described above is designed using double diffused metal-oxide semiconductor (DMOS) transistors for the transistors M1 through M3. Such DMOS-based circuit design provides a size reduction of the voltage regulator 1, especially in the current sensing circuit 9.

For example, assuming that the output transistor M1 is a DMOS transistor having a gate width of 80,000 μm and a gate length of 1.5 μm, appropriate gate sizes for the other DMOS transistors may be 10 μm width and 1.5 μm length for the transistor M2, and 20 μm width and 1.5 μm length for the transistor M3. With the output transistor M1 of this size, forming one of the transistors M2 and M3 as a conventional non-DMOS device would require a larger gate size, such as 100 μm width and 5.0 μm length for the transistor M2, and 200 μm width and 5.0 μm length for the transistor M3.

Each of the DMOS transistors M1 through M3 has a gate oxide layer with a particular gate-oxide-layer breakdown voltage, BVm1 for the transistor M1, BVm2 for the transistor M2, and BVm3 for the transistor M3. The gate-oxide-layer breakdown voltage indicates a voltage that, when applied to the transistor gate, causes overvoltage failures such as a dielectric breakdown or a significant increase in transistor threshold voltage.

In the voltage regulator 1, the diodes D1 and D2 serve to provide protection against such overvoltage failures. The diode D1 has a breakdown voltage BVd1 lower than each of the breakdown voltages BVm1 and BVm2. The diode D2 has a breakdown voltage BVd2 lower than the breakdown voltage BVm3.

Under normal circumstances where each of the transistors M1 through M3 conducts current with a source voltage higher than a gate voltage, each of the diodes D1 and D2 is reverse-biased.

Consider a case where, upon detection of an increase in the output voltage Vout, the error amplifier 5 outputs a signal that turns off the transistors M1 and M2. This causes a condition where the drain voltage of the transistor M2 is substantially equal to ground, while the operational amplifier 7 receives a substantially ground voltage at the inverting input and a high voltage at the non-inverting input to generate a high output substantially equal to the input voltage Vin.

If the diode D2 were not provided, such a case would result in a high voltage, i.e., Vin, applied between the gate and source of the transistor M3, causing the gate-to-source voltage of the transistor M3 to reach the breakdown voltage BVm3 when the input voltage Vin is above the breakdown voltage BVm3.

In the voltage regulator 1, however, the diode D2 becomes forward-biased to conduct a current at a forward voltage, so that the gate-to-source voltage of the transistor M3 does not exceed the forward voltage. This provides protection against overvoltage failures that would be expected to occur in the absence of the diode D2.

Further, consider a case where, after a turn-off of the output transistor M1 that causes the output voltage Vout to be substantially equal to ground, the error amplifier 5 outputs a signal that turns on the transistors M1 and M2. This causes a condition where the drain voltage of the transistor M2 is substantially equal to the input voltage Vin, while the operational amplifier 7 receives a substantially ground voltage at the inverting input and at the non-inverting input, respectively, to generate a low output substantially equal to ground.

If the diode D2 were not provided, such a case would result in a high voltage, i.e., Vin, applied between the gate and source of the transistor M3, causing the gate-to-source voltage of the transistor M3 to reach the breakdown voltage BVm3 when the input voltage Vin is above the breakdown voltage BVm3.

In the voltage regulator 1, however, the diode D2 breaks down to conduct a reverse current when a reverse voltage applied thereto reaches the breakdown voltage BVd2, so that the gate-to-source voltage of the transistor M3 does not exceed the breakdown voltage BVd2. This provides protection against overvoltage failures that would be expected to occur in the absence of the diode D2.

The diode D1 provides overvoltage protection for the transistors M1 and M2 in a similar manner as described above. To provide high stability in such overvoltage protection, it is desirable to form each of the diodes D1 and D2 as a semiconductor device that is independent of a substrate and has a reduced leak current, such as an NPN bipolar transistor with a collector and a base connected to each other.

In a further embodiment of this patent specification, the current sensing circuit 9 may be formed without the operational amplifier 7, the transistor M3, and the diode D2.

In a still further embodiment, the output transistor M1 may be any type of MOS devices other than a DMOS transistor, and either one of the transistors M2 and M3 may be a non-DMOS transistor.

This invention may be conveniently implemented using a conventional general-purpose digital computer programmed according to the teachings of the present specification, as will be apparent to those skilled in the computer arts. Appropriate software coding can readily be prepared by skilled programmers based on the teachings of the present disclosure, as will be apparent to those skilled in the software arts. The present invention may also be implemented by the preparation of application-specific integrated circuits or by interconnecting an appropriate network of conventional component circuits, as will be readily apparent to those skilled in the art.

Numerous additional modifications and variations are possible in light of the above teachings. It is therefore to be understood that, within the scope of the appended claims, the disclosure of this patent specification may be practiced otherwise than as specifically described herein.

What is claimed as new and desired to be protected by Letters Patent of the United States is:

1. A current sensing circuit for sensing an output current generated by a voltage regulator, the current sensing circuit comprising:
   a first double-diffused metal-oxide semiconductor transistor, having a first gate terminal to receive an output control signal from a control circuit of the voltage regulator, configured to output a current proportional to the output current according to the output control signal;
   a current-voltage converter, connected to the first double-diffused metal-oxide semiconductor transistor, configured to convert the proportional current to a corresponding voltage; and
   a sub-circuit connected between a first drain terminal of the first double-diffused metal-oxide semiconductor transistor and the current-voltage converter,
   the sub-circuit including:
      a control element configured to output a current control signal; and
      a second double-diffused metal-oxide semiconductor transistor, connected between the first drain terminal of the first double-diffused metal oxide semiconductor transistor and the current-voltage converter and having a second gate terminal to receive the current control signal, configured to control current flow therethrough according to the current control signal.

2. The current sensing circuit according to claim 1, further comprising a first diode disposed between the first gate terminal and a first source terminal of the first double-diffused metal-oxide semiconductor transistor and having a breakdown voltage lower than a gate-oxide-layer breakdown voltage of the first double-diffused metal-oxide semiconductor transistor, the first diode configured to protect the first gate terminal.

3. The current sensing circuit according to claim 1, further comprising a second diode disposed between the second gate terminal and a second source terminal of the second double-diffused metal-oxide semiconductor transistor and having a breakdown voltage lower than a gate-oxide-layer breakdown voltage of the second double-diffused metal-oxide semiconductor transistor, the second diode configured to protect the second gate terminal.

4. The current sensing circuit according to claim 1, wherein the control element is an operational amplifier having a first input to receive a voltage at the first drain terminal, a second input to receive the output voltage, and an output to transmit the current control signal.

5. The current sensing circuit according to claim 4, wherein the sub-circuit controls the voltage at the first drain terminal to be substantially equal to the output voltage to stabilize the proportional current prior to conversion to the corresponding voltage.

6. A voltage regulator, comprising:
   an input terminal configured to receive an input voltage;
   an output terminal configured to provide a regulated output voltage and an output current;
   an output transistor, having a control terminal to receive an output control signal, configured to control current flow therethrough according to the output control signal to regulate the output voltage;
   a control circuit configured to provide the output control signal so that a voltage proportional to the output voltage is substantially equal to a given reference voltage; and
   a current sensing circuit configured to sense the output current, the current sensing circuit including:
      a first double-diffused metal-oxide semiconductor transistor, having a first gate terminal to receive the output control signal, configured to output a current proportional to the output current according to the output control signal;
      a current-voltage converter, connected to the first double-diffused metal-oxide semiconductor transistor, configured to convert the proportional current to a corresponding voltage; and
      a sub-circuit connected between a first drain terminal of the first double-diffused metal-oxide semiconductor transistor and the current-voltage converter,
      the sub-circuit including:
         a control element configured to output a current control signal; and
         a second double-diffused metal-oxide semiconductor transistor, connected between the first drain terminal of the first double-diffused metal oxide semiconductor transistor and the current-voltage converter and having a second gate terminal to receive the current control signal, configured to control current flow therethrough according to the current control signal.

7. The voltage regulator according to claim 6, further comprising a first diode disposed between the first gate terminal and a first source terminal of the first double-diffused metal-oxide semiconductor transistor and having a breakdown voltage lower than a gate-oxide-layer breakdown voltage of the first double-diffused metal-oxide semiconductor transistor, the first diode configured to protect the first gate terminal.

8. The voltage regulator according to claim 6, further comprising a second diode disposed between the second gate terminal and a second source terminal of the second double-diffused metal-oxide semiconductor transistor and having a breakdown voltage lower than a gate-oxide-layer breakdown voltage of the second double-diffused metal-oxide semiconductor transistor, the second diode configured to protect the second gate terminal.

9. The voltage regulator according to claim 6, wherein the control element is an operational amplifier having a first input to receive a voltage at the first drain terminal, a second input to receive the output voltage, and an output to transmit the current control signal.

10. The voltage regulator according to claim 9, wherein the sub-circuit controls the voltage at the first drain terminal to be substantially equal to the output voltage to stabilize the proportional current prior to conversion to the corresponding voltage.

11. The voltage regulator according to claim 6, further comprising a current limiting circuit including the current sensing circuit, the current limiting circuit configured to determine whether the output current reaches a given maximum limit, and upon so determining, output a current limit signal to the output transistor to maintain the output current at or below the given maximum limit.

12. The voltage regulator according to claim 11, wherein the output transistor, the control circuit, and the current limiting circuit are constructed on a single integrated circuit.

13. A current sensing circuit for sensing an output current generated by a voltage regulator, the current sensing circuit comprising:
   a first transistor, having a first gate terminal to receive an output control signal from a control circuit of the voltage regulator, configured to output a current proportional to the output current according to the output control signal;
   a current-voltage converter, connected to the first transistor, configured to convert the proportional current to a corresponding voltage; and
   a sub-circuit connected between a first drain terminal of the first transistor and the current-voltage converter, the sub-circuit including:
      a control element configured to output a current control signal; and
      a second transistor being a double-diffused metal-oxide semiconductor transistor, connected between the first drain terminal of the first double-diffused metal oxide semiconductor transistor and the current-voltage converter and having a second gate terminal to receive the current control signal, configured to control current flow therethrough according to the current control signal.

14. The current sensing circuit according to claim 13, further comprising a first diode disposed between the first gate terminal and a first source terminal of the first transistor and having a breakdown voltage lower than a gate-oxide-layer breakdown voltage of the first transistor, the first diode configured to protect the first gate terminal.

15. The current sensing circuit according to claim 13, further comprising a second diode disposed between the second gate terminal and a second source terminal of the second transistor and having a breakdown voltage lower than a gate-oxide-layer breakdown voltage of the second transistor, the second diode configured to protect the second gate terminal.

16. The current sensing circuit according to claim 13, wherein the control element is an operational amplifier having a first input to receive a voltage at the first drain terminal, a second input to receive the output voltage, and an output to transmit the current control signal.

17. The current sensing circuit according to claim 16, wherein the sub-circuit controls the voltage at the first drain terminal to be substantially equal to the output voltage to stabilize the proportional current prior to conversion to the corresponding voltage.

* * * * *